United States Patent
Kwon et al.

(10) Patent No.: US 9,602,236 B2
(45) Date of Patent: Mar. 21, 2017

(54) COMPUTING SYSTEM WITH DECODING ADJUSTMENT MECHANISM AND METHOD OF OPERATION THEREOF

(71) Applicant: Samsung Electronics Co., Ltd., Suwon-si, Gyeonggi-Do (KR)

(72) Inventors: Hyukjoon Kwon, San Diego, CA (US); Jungwon Lee, San Diego, CA (US); Inyup Kang, San Diego, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 174 days.

(21) Appl. No.: 14/305,646

(22) Filed: Jun. 16, 2014

(65) Prior Publication Data

US 2014/0372835 A1    Dec. 18, 2014

Related U.S. Application Data

(60) Provisional application No. 61/836,534, filed on Jun. 18, 2013.

(51) Int. Cl.
*H04L 1/00* (2006.01)
*H03M 13/35* (2006.01)
*G11B 20/18* (2006.01)

(52) U.S. Cl.
CPC .......... *H04L 1/0045* (2013.01); *H03M 13/35* (2013.01); *H04L 1/0009* (2013.01);
(Continued)

(58) Field of Classification Search
CPC ...... H03M 13/11; H03M 13/27; H03M 13/35; G11B 20/1833; H04L 1/0057; H04L 1/0041; H04L 1/0009; H04L 1/0026
(Continued)

(56) References Cited

U.S. PATENT DOCUMENTS 7,362,733 B2   4/2008   Kim et al.
7,376,209 B2   5/2008   Namgoong et al.
(Continued)

FOREIGN PATENT DOCUMENTS

EP   1985026 A2   10/2008
EP   2204984 A1   7/2010
EP   1264408 B2   4/2011

OTHER PUBLICATIONS

H. Claussen, H. Karimi, and B Mulgrew, "Improved max-log-MAP turbo decoding by maximization of mutual information transfer," EURASIP Journal on Applied Signal Processing, vol. 6, pp. 820-827, 2005.
(Continued)

*Primary Examiner* — Albert Decady
*Assistant Examiner* — Osman M Alshack
(74) *Attorney, Agent, or Firm* — IP Investment Law Group

(57) ABSTRACT

A computing system includes: an inter-device interface configured to receive a receiver signal for representing a serving signal; a communication unit, coupled to the inter-device interface, configured to: calculate a decoding result based on decoding the receiver signal, generate a parity portion adjustment for adjusting the decoding result, generate a systematic portion adjustment for adjusting the decoding result, and apply the parity portion adjustment and the systematic portion adjustment to the decoding result for determining the serving signal from the receiver signal.

19 Claims, 4 Drawing Sheets

(52) U.S. Cl.
CPC ........ *H04L 1/0057* (2013.01); *G11B 20/1833* (2013.01); *H04L 1/0026* (2013.01); *H04L 1/0041* (2013.01)

(58) Field of Classification Search
USPC ........................................ 714/752, 774, 776
See application file for complete search history.

(56) References Cited

U.S. PATENT DOCUMENTS

| | | | |
|---|---|---|---|
| 7,912,150 B2* | 3/2011 | Kim .................... | H04L 1/0003 375/316 |
| 8,234,556 B2 | 7/2012 | Gamage et al. | |
| 8,254,502 B2 | 8/2012 | Sambhwani et al. | |
| 2001/0039636 A1* | 11/2001 | Hammons .......... | H03M 13/296 714/752 |
| 2005/0086570 A1* | 4/2005 | Ariyoshi .......... | H03M 13/2957 714/755 |
| 2007/0147481 A1* | 6/2007 | Bottomley ........ | H03M 13/2957 375/148 |
| 2007/0217522 A1* | 9/2007 | Sun ........................ | H03M 7/40 375/242 |
| 2007/0245211 A1* | 10/2007 | Kim ................... | H03M 13/1102 714/758 |
| 2008/0016425 A1* | 1/2008 | Khan ................ | H03M 13/2957 714/755 |
| 2008/0092010 A1* | 4/2008 | Orio .................. | H03M 13/2957 714/755 |
| 2008/0092028 A1* | 4/2008 | Orio .................. | H03M 13/2957 714/796 |
| 2012/0051307 A1* | 3/2012 | Huang ................. | H04L 5/0037 370/329 |
| 2012/0099638 A1* | 4/2012 | Wang .................... | H04L 1/005 375/233 |
| 2012/0249346 A1 | 10/2012 | Salvekar et al. | |
| 2013/0155967 A1 | 6/2013 | Kang et al. | |
| 2013/0156139 A1 | 6/2013 | Lee et al. | |

OTHER PUBLICATIONS

J. Wu, M. El-Khamy, J. Lee and I. Kang, "BICM Performance Improvement via Online LLR Optimization," IEEE WCNC, 2013.

E.Zimmermann, D.Milliner, J.Barry, and G.Fettweis; "Optimal LLR Clipping Levels for Mixed Hard/Soft Output Detection", Globecom 2008 1122-1126, 2008.

K.Narayanan, and G.Stuber; "A Novel ARQ Technique using the Turbo Coding Principle", IEEE Communications Letters, vol. 1, No. 2, Mar. 1997, pp. 49-51.

S.Godtmann, H.Luders, G.Ascheid, and P.Vary, "A Bit-Mapping Strategy for Joint Iterative Channel Estimation and Turbo-Decoding", Vehicular Technology Conference, 2008, VTC 2008-Fall, IEEE 68th, Sep. 2008.

* cited by examiner

COMPUTING SYSTEM WITH DECODING ADJUSTMENT MECHANISM AND METHOD OF OPERATION THEREOF

CROSS-REFERENCE TO RELATED APPLICATION(S)

This application claims the benefit of U.S. Provisional Patent Application Ser. No. 61/836,534 filed Jun. 18, 2013, and the subject matter thereof is incorporated herein by reference thereto.

TECHNICAL FIELD

An embodiment of the present invention relates generally to a computing system, and more particularly to a system with decoding adjustment mechanism.

BACKGROUND

Modern consumer and industrial electronics, especially devices such as cellular phones, navigations systems, portable digital assistants, and combination devices, are providing increasing levels of functionality to support modern life including mobile communication. Research and development in the existing technologies can take a myriad of different directions.

The increasing demand for information in modern life requires users to access information at any time, at increasing data rates. However, telecommunication signals used in mobile communication effectively experience various types of hindrances from numerous sources, as well as computational complexities rising from numerous possible formats for communicated information, which affect the quality and speed of the accessible data.

Thus, a need still remains for a computing system with decoding adjustment mechanism. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides a computing system, including: an inter-device interface configured to receive a receiver signal for representing a serving signal; a communication unit, coupled to the inter-device interface, configured to: calculate a decoding result based on decoding the receiver signal, generate a parity portion adjustment for adjusting the decoding result, generate a systematic portion adjustment for adjusting the decoding result, and apply the parity portion adjustment and the systematic portion adjustment to the decoding result for determining the serving signal from the receiver signal.

An embodiment of the present invention provides a method of operation of a computing system including: receiving a receiver signal for representing a serving signal; calculating a decoding result based on decoding the receiver signal; generating a parity portion adjustment with a communication unit for adjusting the decoding result; generating a systematic portion adjustment with the communication unit for adjusting the decoding result; and applying the parity portion adjustment and the systematic portion adjustment to the decoding result for determining the serving signal from the receiver signal.

An embodiment of the present invention provides a non-transitory computer readable medium including instructions for operating a computing system including: receiving a receiver signal for representing a serving signal; calculating a decoding result based on decoding the receiver signal; generating a parity portion adjustment with a communication unit for adjusting the decoding result; generating a systematic portion adjustment with the communication unit for adjusting the decoding result; and applying the parity portion adjustment and the systematic portion adjustment to the decoding result for determining the serving signal from the receiver signal.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

Figure 1:
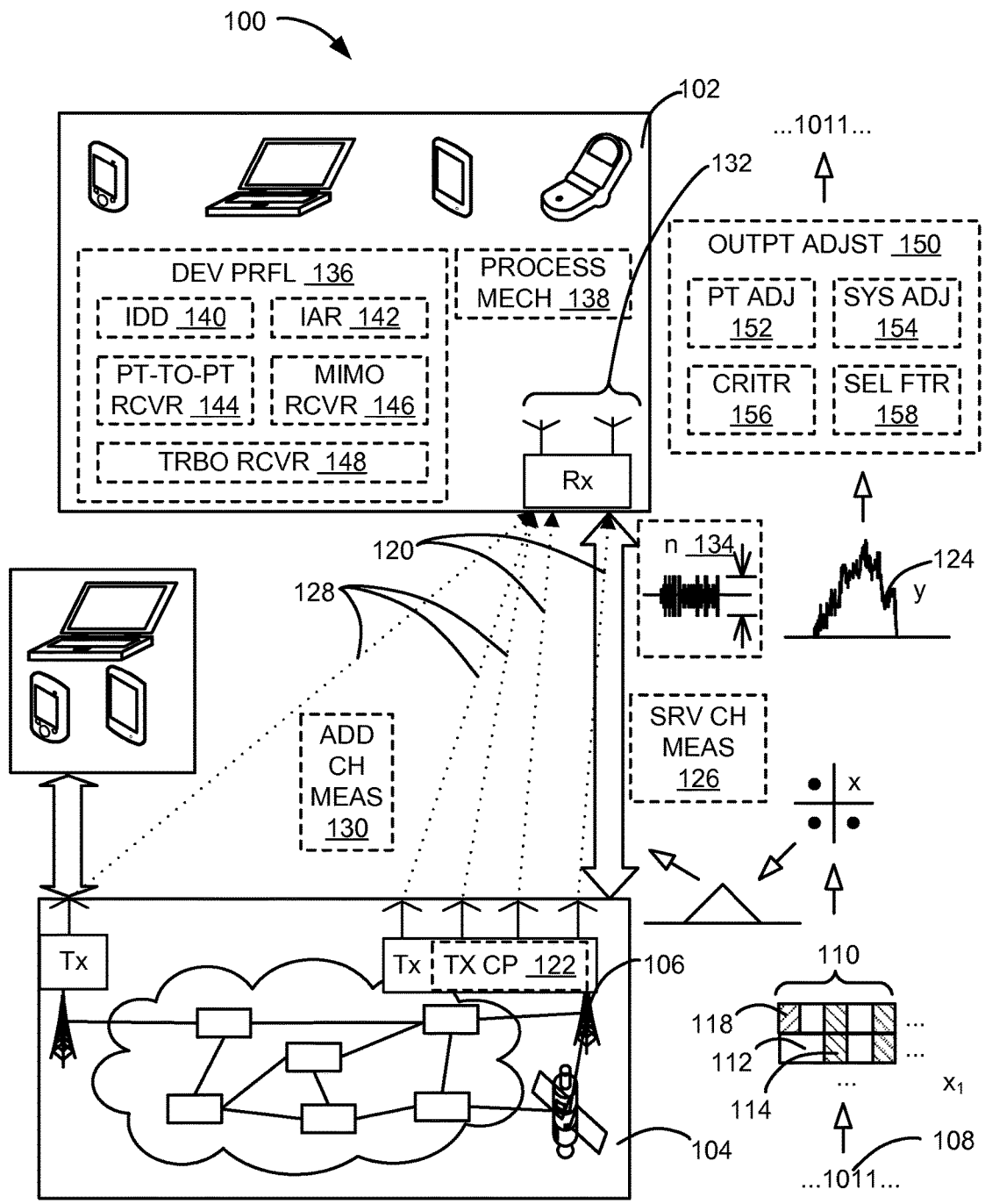
FIG. 1 is a computing system with decoding adjustment mechanism in an embodiment of the present invention.

The following embodiments of the present invention can be used to adjust decoding output specific to systematic information, parity information, or a combination thereof for the code word. A parity portion adjustment can be applied to a parity output data of the decoding output, a systematic portion adjustment can be applied to a systematic output data of the decoding output, or a combination thereof. The adjustments can be made according to an adjustment criterion and using average values.

The following embodiments are described in sufficient detail to enable those skilled in the art to make and use the invention. It is to be understood that other embodiments would be evident based on the present disclosure, and that system, process, or mechanical changes may be made without departing from the scope of an embodiment of the present invention.

In the following description, numerous specific details are given to provide a thorough understanding of the invention. However, it will be apparent that the invention may be practiced without these specific details. In order to avoid obscuring an embodiment of the present invention, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation. The embodiments have been numbered first embodiment, second embodiment, etc. as a matter of descriptive convenience and are not intended to have any other significance or provide limitations for an embodiment of the present invention.

The term "module" referred to herein can include or be implemented as software, hardware, or a combination thereof in the present invention in accordance with the context in which the term is used. For example, the software can be machine code, firmware, embedded code, and application software. The software can also include a function, a call to a function, a code block, or a combination thereof. Also for example, the hardware can be gates, circuitry, processor, computer, integrated circuit, integrated circuit cores, a pressure sensor, an inertial sensor, a microelectromechanical system (MEMS), passive devices, physical non-transitory memory medium having instructions for performing the software function, a portion therein, or a combination thereof.

The term "processing" as used herein includes manipulating signal and corresponding data, such as filtering, detecting, decoding, assembling data structures, transferring data structures, manipulating data structures, and reading and writing data structures. Data structures are defined to be information arranged as symbols, packets, blocks, files, input data, system generated data, such as calculated or generated data, and program data.

Referring now to FIG. 1, therein is shown a computing system 100 with decoding adjustment mechanism in an embodiment of the present invention. The computing system 100 includes a first device 102, such as a mobile device including a cellular phone or a notebook computer, connected to a network 104. The network 104 is a system of wired or wireless communication devices or means that are connected to each other for enabling communication between devices.

For example, the network 104 can include a combination of wires, transmitters, receivers, antennas, towers, stations, repeaters, telephone network, servers, or client devices for a wireless cellular network. The network 104 can also include a combination of routers, cables, computers, servers, and client devices for various sized area networks.

The computing system 100 can include a second device 106 for directly or indirectly linking and communicating with the first device 102. The network 104 can include the second device 106. The second device 106 can receive wireless signals from the first device 102, transmit signals to the first device 102, process signals, or a combination thereof. The second device 106 can also relay signals between other base stations, components within the network 104, or a combination thereof.

The first device 102 can be connected to the network 104 through the second device 106. For example, the second device 106 can be a base station, a router, a modem, or a combination thereof. Also for example, the second device 106 can be a communication device or a processing component included or with a cell tower, a wireless router, an antenna, or a combination thereof being used to communicate with, such as by sending signals to or receiving signals from, the first device 102 including a mobile computing device.

The first device 102 can connect to and communicate with other devices, such as other mobile devices, servers, computers, telephones, or a combination thereof. For example, the first device 102 can communicate with other devices by transmitting signals, receiving signals, processing signals, or a combination thereof and displaying a content of the signals, audibly recreating sounds according to the content of the signals, processing according to the content, such as storing an application or updating an operating system, or a combination thereof.

The second device 106 can be used to wirelessly exchange signals for communication, including voice signals of a telephone call or data representing a webpage and interactions therewith. The second device 106 can also transmit reference signals, training signals, error detection signals, error correction signals, header information, transmission format, protocol information, or a combination thereof.

Based on the communication method, such as code division multiple access (CDMA), orthogonal frequency-division multiple access (OFDMA), Third Generation Partnership Project (3GPP), Long Term Evolution (LTE), or fourth generation (4G) standards, the communication signals can include a reference portion, a header portion, a format portion, an error correction or detection portion, or a combination thereof imbedded in the communicated information. The reference portion, header portion, format portion, error correction or detection portion, or a combination thereof can include a predetermined bit, pulse, wave, symbol, or a combination thereof. The various portions can be embedded within the communicated signals at regular time intervals, frequency, code, or a combination thereof.

The second device 106 can communicate serving content 108 intended for the first device 102. The serving content 108 can include data from a transmitting device intended for communication by reproduction or processing at a receiving device. For example, the serving content 108 can be a sequence of bits intended for displaying, audibly recreating, executing instructions, storing, or a combination thereof at a receiving device, such as the first device 102.

The second device 106 can modify the serving content 108 to generate a code word 110 for communicating the serving content 108. The code word 110 is a unit of information having a length and a format predetermined by the computing system 100, a standard, a known routine, or a combination thereof for communicating information between devices. For example, the code word 110 can be based on a turbo coding routine or a polar coding routine.

The code word 110 can be a processing result of inter-leaving or de-interleaving the code word 110, adding format or supporting information, such as error processing information or header information, or a combination thereof. For example, the code word 110 can include systematic information 112, parity information 114, or a combination thereof.

The systematic information 112 is a portion or data within the code word 110 corresponding to the serving content 108. The systematic information 112 can be rearranged according to the predetermined format or routine to generate the systematic information 112. The systematic information 112 can further include additional information for processing, representing, or transforming the serving content 108.

The parity information 114 is a portion or data within the code word 110 corresponding to determining an accuracy in processing for the serving content 108. The parity information 114 can be for determining a validity in recovering or estimating the serving content 108. The parity information 114 can be an indication regarding the serving content 108, such as whether the number of bits in the serving content 108 or a specific portion therein is even or odd.

The computing system 100 can use one or more instances of the code word 110 to generate and transmit a serving signal 116. The serving signal 116 can be data actually transmitted by a device for communication and having a format for transmission. The serving signal 116 can be represented as 'x'.

The serving signal 116 can include a reference portion 118. The reference portion 118 is a known signal transmitted by a device that is used to determine various types of information at a receiving device. The reference portion 118 can include a bit, a symbol, a signal pattern, a signal strength, frequency, phase, duration, or a combination thereof predetermined by the computing system 100, a standard, or a combination thereof. The details of the reference portion 118 can be known and used by one or all devices in the computing system 100.

The reference portion 118 can include generic information, cell-specific information, or a combination thereof. The reference portion 118 can further include information regarding a transmission format. The detail, the structure, the content, or a combination thereof for the reference portion 118 can be used by the receiving device, such as the first device 102, to determine information regarding a mechanism used to transmit data.

The serving signal 116 can be based on single-input single output (SISO) communication scheme, a point-to-point communication scheme, or a multiple-input multiple-output (MIMO) communication scheme. The serving signal 116 can include a base stream 120. The base stream 120 is one or more independent and consecutive sequence of information dedicated for communicating information.

The base stream 120 can include continuous set of information transmitted through each of the available transmitter, antenna, port, or a combination thereof. The base stream 120 can be one or more instances of a layer, a pairing of a transmitting antenna and a receiving antenna, a unique sequence or portion of information corresponding to a geographic attribute, or a combination thereof. For example, each instance of the base stream 120 can be information communicated through a particular antenna on the second device 106, received through a particular antenna at the first device 102, or a combination thereof.

The serving signal 116 can be characterized by a transmission capacity 122. The transmission capacity 122 is an indication of magnitude or format of the serving signal 116. The transmission capacity 122 can be a quantity of independent instances of the base stream 120 utilized by the transmitting device. The transmission capacity 122 can correspond to number of transmitting antennas used for the serving signal 116.

The serving signal 116 can traverse a serving channel and be detected as part of a receiver signal 124 at the intended receiver. The serving signal 116 can be altered from traversing the serving channel. The altering effects of the serving channel can be characterized by a serving channel estimate 126. For example, the serving channel estimate 126 can represent fading, distortions or alterations from delayed signals or echoes, or a combination thereof of the serving channel.

The computing system 100 can calculate the serving channel estimate 126 using the reference portion 118 or a segment in the receiver signal 124 corresponding to the reference portion 118 of the serving signal 116. The estimate of communication channel, including the serving channel estimate 126, can be represented as 'H'.

The receiver signal 124 can be information received or detected at a device. The receiver signal 124 can include the serving signal 116 or a derivation thereof. The receiver signal 124 can further include information unintended for communication with the receiving device. For example, the receiver signal 124 can include an additional stream 128, which can be characterized with an additional channel estimate 130, a noise portion, or a combination thereof.

The additional stream 128 is communication information separate from the base stream 120. The additional stream 128 can be information being communicated between different set of transmitter and receiver, but received at an unintended receiver. The additional stream 128 can be an interference signal from a device other than the first device 102 and other than the second device 106.

The additional stream 128 can be further based on a receiver capacity 132. The receiver capacity 132 is a representation of an ability or a complexity in processing the receiver signal 124 available for a receiving device. The receiver capacity 132 can represent a dimensionality of the receiving device, such as the first device 102. The receiver capacity 132 can further be associated with a number of antennas or a number of independent instances of the base stream 120 capable of simultaneously processing at the receiving device.

The additional stream 128 can be the one or more instances of data stream in addition to or in excess of the receiver capacity 132. The additional stream 128 can be based on rank deficiency, where the receiver capacity 132 is less than the transmission capacity 122 for the serving signal 116. The additional stream 128 can be one or more instances of the layer or the stream exceeding the receiver capacity 132 such as for point-to-point communication or communication simultaneously utilizing multiple streams.

The additional channel estimate 130 can be a characterization of a channel corresponding to the additional stream 128. The additional channel estimate 130 can be the same value or instance as the serving channel estimate 126 or different from the serving channel estimate 126.

The noise portion can include error or deviations in the data. The noise portion can be from a processing channel or a route for the data, hardware components processing signals, background noise, or a combination thereof. The noise portion can also include changes in the signal or the data due to hardware component limitations, such as tolerance levels or cross-talk between components.

The noise portion can be additive in nature and have a random Gaussian or Rayleigh distribution for the changes. The noise portion can also be independent and identically distributed (i.i.d.) sequence of uncorrelated circularly symmetric complex Gaussian random vector with zero mean. The noise portion can be represented as 'n'.

The noise portion can be characterized by a noise measure 134. The noise measure 134 can include a quantitative representation of the noise portion. The noise measure 134 can be a statistical characteristic of the noise portion. The noise measure 134 can be a variance or a covariance value, a measure of spread, distancing, density, power, or a combination thereof for the noise portion. The noise measure 134 can be known or detectable to the computing system 100. The noise measure 134 can be represented as '$\sigma^2$'.

The receiver signal 124 can be represented as:

$$y=\sqrt{P_1}H^1x^1+\sqrt{P_n}H^2x^2+n. \qquad \text{Equation (1)}.$$

The term 'P' can represent an effective channel gain combined with transmitter power. The superscripts '1' and '2' can represent two different instances of the code word 110, with one instance corresponding to the serving signal 116 and the other instance corresponding to the additional stream 128.

For example, '$H^1$' can represent the serving channel estimate 126 and '$x^1$' can represent the serving signal 116 or the information transmitted over the base stream 120. Also for example, the term '$H^2$' can represent the additional channel estimate 130, and the term '$x^2$' can represent the instance of the code word 110 transmitted over the additional stream 128 for a rank-deficient condition, corresponding to an interference signal, or a combination thereof.

The computing system 100 can include a device profile 136. The device profile 136 can be a description or an attribute of one or more device in the computing system 100, one or more component therein, or a combination thereof. For example, the device profile 136 can describe the first device 102, the second device 106, or a combination thereof. Also for example, the device profile 136 can describe a receiver, a detector or a decoder therein, a transmitter, an antenna, or a combination thereof for the first device 102, the second device 106, or a combination thereof.

For example, the device profile 136 can include a receiver processing mechanism 138, an iterative detection-decoding mechanism 140, an interference-aware receiver 142, a point-to-point receiver 144, a multiple stream receiver 146, a turbo receiver 148, or a combination thereof. Also for example, the device profile 136 can include the receiver capacity 132.

The receiver processing mechanism 138 is an overall process, method, architecture, or a combination thereof for processing the receiver signal 124. The receiver processing mechanism 138 can include statistical models or estimates. For example, the receiver processing mechanism 138 can include maximum a posteriori (MAP) mechanism or a derivation thereof, such as max-log-MAP (MLM), for the receiving device, such as the first device 102 or a portion therein.

The iterative detection-decoding (IDD) mechanism 140 is a method or process for determining the serving content 108 from the receiver signal 124 through repeated processing and interaction between the detection process and the decoding process. The iterative detection-decoding mechanism 140 can include a direct coupling and interaction between a detection process, for recognizing symbols or information from detecting signals, and a decoding process, for recognizing content information from recognized symbols or detected information.

The iterative detection-decoding mechanism 140 can include a feed-forward information from the detection process to the decoding process, a feed-back information from the decoding process to the detection process or a combination thereof. The iterative detection-decoding mechanism 140 can use the result of the detection process for the decoding process, the result of the decoding process for the detection process, or a combination thereof.

The interference-aware receiver (IAR) 142 is a device or a portion thereof configured to process and utilize a signal received at the receiving device but unintended for the receiving device. The interference-aware receiver 142 can be the device or the portion thereof recognizing and utilizing the information in the additional stream 128 including the interference signal in the receiver signal 124 to process for the serving content 108. The interference-aware receiver 142 can recognize the content of the interference signal and remove it from the receiver signal 124 to process for the serving content 108.

The interference-aware receiver 142 can include an interference aware detector, decoder, or a combination thereof. The interference-aware receiver 142 can further include a joint detector, decoder, or a combination thereof configured to recognize, whiten, cancel or remove, detect, decode, or a combination thereof for interference signal in processing the serving signal 116.

The point-to-point receiver 144 is a device or a portion therein configured to communicate with one device or one instance of the base stream 120. The point-to-point receiver 144 can use communication dedicated for one transmission source, one receiving point, or a combination thereof. The point-to-point receiver 144 can be the device or the portion therein for the SISO communication scheme.

The multiple stream receiver 146 is a device or a portion therein configured to communicate with multiple instances of the base stream 120. The multiple stream receiver 146 can use communication dedicated for multiple transmission source, multiple receiving points, or a combination thereof. The multiple stream receiver 146 can be the device or the portion therein for the MIMO communication scheme. The multiple stream receiver 146 can include a MIMO detector.

The turbo receiver 148 is a device or a portion therein configured to utilize utilizing a-priori, a-posteriori, and extrinsic values based on calculating outcomes in a structure or a process without using a previous outcome of the structure or the process. The turbo receiver 148 can calculate an extrinsic value, interleave or de-interleave data, or a combination thereof based on an output value or an a-posteriori value. The turbo receiver 148 can use the extrinsic value from a different process or a different structure as an a-priori value. The turbo receiver 148 can include a turbo detector or a turbo decoder.

The device profile 136 can describe the first device 102 receiving and processing the receiver signal 124. For example, the first device 102 can include a circuit, a component, a software, a configuration, or a combination thereof for the receiver processing mechanism 138, the iterative detection-decoding mechanism 140, the interference-aware receiver 142, the point-to-point receiver 144, the multiple stream receiver 146, the turbo receiver 148, or a combination thereof. Also for example, the first device 102 can further receive the receiver signal 124 according to the receiver capacity 132.

The computing system 100 can use the device profile 136 to generate an output adjustment 150 in processing for the serving signal 116, the serving content 108 therein, or a combination thereof from the receiver signal 124. The output adjustment 150 can include a change or an update to a process or a result of a process for receiving or processing the receiver signal 124. For example, the output adjustment 150 can be for changing or updating a result of a decoding process, a detection process, or a combination thereof.

The output adjustment 150 can include various aspects. For example, the output adjustment 150 can include a parity portion adjustment 152, a systematic portion adjustment 154, an adjustment criterion 156, an adjustment selection factor 158, or a combination thereof.

The parity portion adjustment 152 is a change or an adjustment to a result of processing the parity information 114. The parity portion adjustment 152 can be an operation, a process, an adjustment value, or a combination thereof. For example, the parity portion adjustment 152 can be implemented as an offset or a scaling factor.

The systematic portion adjustment 154 is a change or an adjustment to a result of processing the systematic information 112. The systematic portion adjustment 154 can be an operation, a process, an adjustment value, or a combination thereof. For example, the systematic portion adjustment 154 can be implemented as an offset or a scaling factor.

The adjustment criterion 156 is a goal or a condition controlling the output adjustment 150. The adjustment criterion 156 can include the goal or the condition to be required by using the output adjustment 150. The adjustment criterion 156 can be a state or a requirement sought to be satisfied with the output adjustment 150.

The adjustment selection factor 158 is a value, a parameter, or a combination thereof controlling the output adjustment 150. The adjustment selection factor 158 can be the fields or the types of information considered in selecting a value or a specific instance of the output adjustment 150. For example, the adjustment selection factor 158 can include a channel type, a system parameter, a Doppler value, or a combination thereof. Also for example, the adjustment selection factor 158 can be based on the transmission capacity 122, the receiver capacity 132, the serving channel estimate 126, the additional channel estimate 130, or a combination thereof.

The adjustment criterion 156 can require the systematic portion adjustment 154, the parity portion adjustment 152, or a combination thereof to control a relative relationship associated with the systematic information 112, the parity information 114, or a combination thereof. Based on satisfying the adjustment criterion 156, the computing system 100 can evaluate the adjustment selection factor 158.

The computing system 100 can dynamically generate apply the output adjustment 150 based on a situation or a condition as indicated by the adjustment selection factor 158 for processing for the serving content 108 with the receiver signal 124. The computing system 100 can generate a content estimate from the receiver signal 124 for representing the serving content 108 intended for communication with the serving signal 116. Details regarding the output adjustment 150 will be described below.

For illustrative purposes, the first device 102 is described as receiving and processing the receiver signal 124 corresponding to the serving signal 116 from the second device 106. However, it is understood that the computing system 100 can include the second device 106 receiving and processing the receiver signal 124 corresponding to the serving signal 116 from the first device 102.

Figure 2:
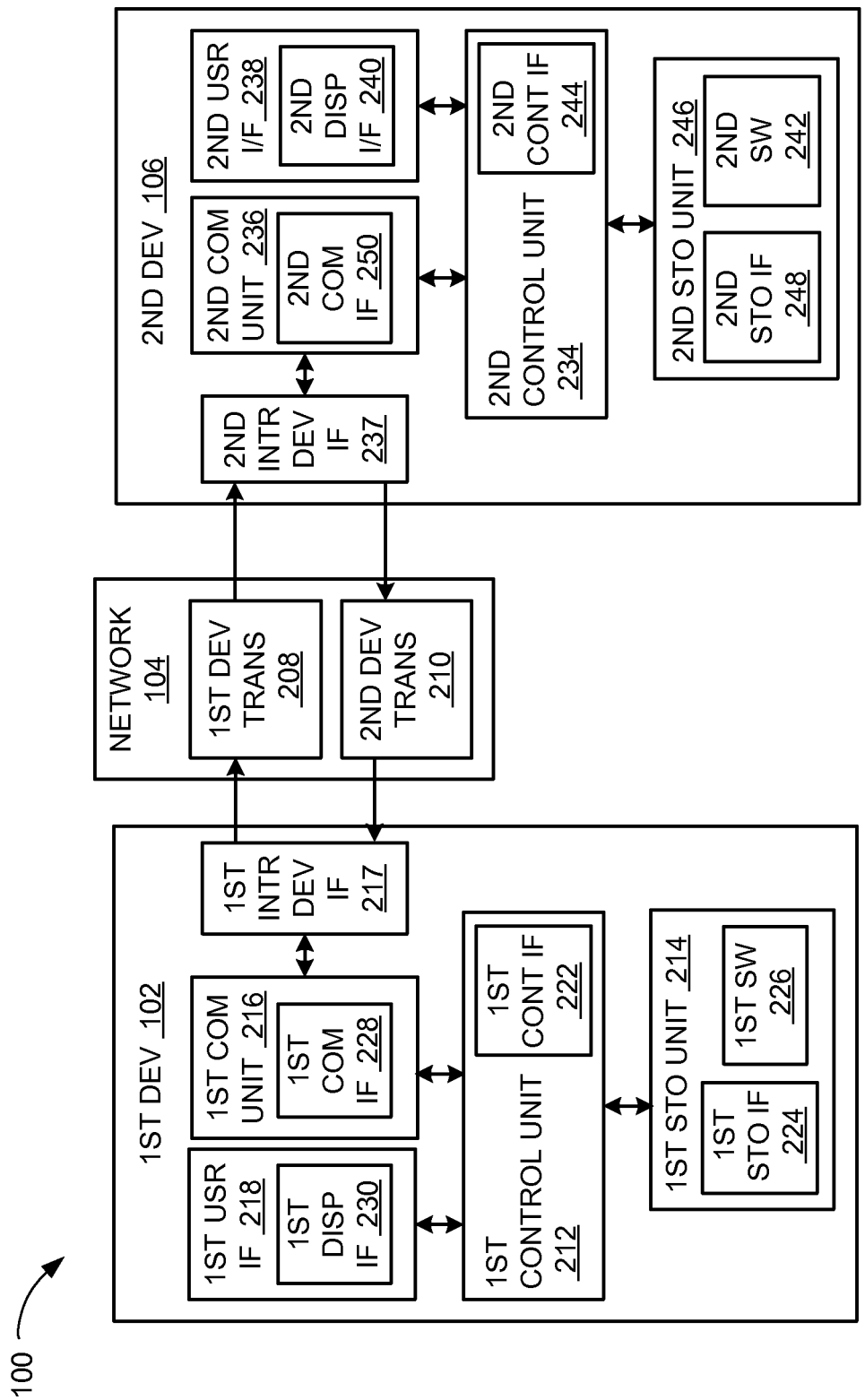
FIG. 2 is an exemplary block diagram of the computing system.

Referring now to FIG. 2, therein is shown an exemplary block diagram of the computing system 100. The computing system 100 can include the first device 102, the network 104, and the second device 106. The first device 102 can send information in a first device transmission 208 over the network 104 to the second device 106. The second device 106 can send information in a second device transmission 210 over the network 104 to the first device 102.

For illustrative purposes, the computing system 100 is shown with the first device 102 as a client device, although it is understood that the computing system 100 can have the first device 102 as a different type of device. For example, the first device 102 can be a server having a display interface.

Also for illustrative purposes, the computing system 100 is shown with the second device 106 as a server, although it is understood that the computing system 100 can have the second device 106 as a different type of device. For example, the second device 106 can be a client device.

For brevity of description in this embodiment of the present invention, the first device 102 will be described as a client device and the second device 106 will be described as a server device. The embodiment of the present invention is not limited to this selection for the type of devices. The selection is an example of an embodiment of the present invention.

The first device 102 can include a first control unit 212, a first storage unit 214, a first communication unit 216, and a first user interface 218. The first control unit 212 can include a first control interface 222. The first control unit 212 can execute a first software 226 to provide the intelligence of the computing system 100.

The first control unit 212 can be implemented in a number of different manners. For example, the first control unit 212 can be a processor, an application specific integrated circuit (ASIC) an embedded processor, a microprocessor, a hardware control logic, a hardware finite state machine (FSM), a digital signal processor (DSP), or a combination thereof. The first control interface 222 can be used for communication between the first control unit 212 and other functional units in the first device 102. The first control interface 222 can also be used for communication that is external to the first device 102.

The first control interface 222 can receive information from the other functional units or from external sources, or can transmit information to the other functional units or to external destinations. The external sources and the external destinations refer to sources and destinations external to the first device 102.

The first control interface 222 can be implemented in different ways and can include different implementations depending on which functional units or external units are being interfaced with the first control interface 222. For example, the first control interface 222 can be implemented with a pressure sensor, an inertial sensor, a microelectromechanical system (MEMS), optical circuitry, waveguides, wireless circuitry, wireline circuitry, or a combination thereof.

The first storage unit 214 can store the first software 226. The first storage unit 214 can also store the relevant information, such as data representing incoming images, data representing previously presented image, sound files, or a combination thereof.

The first storage unit 214 can be a volatile memory, a nonvolatile memory, an internal memory, an external memory, or a combination thereof. For example, the first storage unit 214 can be a nonvolatile storage such as non-volatile random access memory (NVRAM), Flash memory, disk storage, or a volatile storage such as static random access memory (SRAM).

The first storage unit 214 can include a first storage interface 224. The first storage interface 224 can be used for communication between the first storage unit 214 and other functional units in the first device 102. The first storage interface 224 can also be used for communication that is external to the first device 102.

The first storage interface 224 can receive information from the other functional units or from external sources, or can transmit information to the other functional units or to external destinations. The external sources and the external destinations refer to sources and destinations external to the first device 102.

The first storage interface 224 can include different implementations depending on which functional units or external units are being interfaced with the first storage unit 214. The first storage interface 224 can be implemented with technologies and techniques similar to the implementation of the first control interface 222.

The first communication unit 216 can enable external communication to and from the first device 102. For example, the first communication unit 216 can permit the first device 102 to communicate with the second device 106, a different device, an attachment, such as a peripheral device or a desktop computer, the network 104, or a combination thereof.

The first communication unit 216 can also function as a communication hub allowing the first device 102 to function as part of the network 104 and not limited to be an end point or terminal unit to the network 104. The first communication unit 216 can include active and passive components, such as microelectronics or an antenna, for interaction with the network 104.

The first communication unit 216 can include a baseband device or component, a modem, a digital signal processor, or a combination thereof for transmitting, formatting, receiving, detecting, decoding, further processing, or a combination thereof for communication signals. The first communication unit 216 can include one or more portions for processing the voltages, the currents, the digital information, or a combination thereof, such as an analog-to-digital converter, a digital-to-analog converter, a filter, an amplifier, a processor-type circuitry, or a combination thereof. The first communication unit 216 can further include one or more portions for storing information, such as cache or RAM memory, registers, or a combination thereof.

The first communication unit 216 can be coupled with a first inter-device interface 217. The first inter-device interface 217 can be a device or a portion of a device for physically communicating signals with a separate device. The first inter-device interface 217 can communicate by transmitting or receiving signals to or from another device. The first inter-device interface 217 can include one or more antennas for wireless signals, a physical connection and receiver-transmitter for wired signals, or a combination thereof. The first inter-device interface 217 can include an omnidirectional antenna, a wire, an antenna chip, a ceramic antenna, or a combination thereof. The first inter-device interface 217 can further include a port, a wire, a repeater, a connector, a filter, a sensor, or a combination thereof.

The first inter-device interface 217 can detect or respond to a power in electromagnetic waves and provide the detected result to the first communication unit 216 to receive a signal, including the second device transmission 210. The first inter-device interface 217 can provide a path or respond to currents or voltages provided by the first communication unit 216 to transmit a signal, including the first device transmission 208.

The first communication unit 216 can include a first communication interface 228. The first communication interface 228 can be used for communication between the first communication unit 216 and other functional units in the first device 102. The first communication interface 228 can receive information from the other functional units or can transmit information to the other functional units.

The first communication interface 228 can include different implementations depending on which functional units are being interfaced with the first communication unit 216. The first communication interface 228 can be implemented with technologies and techniques similar to the implementation of the first control interface 222.

The first user interface 218 allows a user (not shown) to interface and interact with the first device 102. The first user interface 218 can include an input device and an output device. Examples of the input device of the first user interface 218 can include a keypad, a touchpad, soft-keys, a keyboard, a microphone, an infrared sensor for receiving remote signals, or any combination thereof to provide data and communication inputs.

The first user interface 218 can include a first display interface 230. The first display interface 230 can include an output device. The first display interface 230 can include a display, a projector, a video screen, a speaker, or any combination thereof.

The first control unit 212 can operate the first user interface 218 to display information generated by the computing system 100. The first control unit 212 can also execute the first software 226 for the other functions of the computing system 100. The first control unit 212 can further execute the first software 226 for interaction with the network 104 via the first communication unit 216.

The second device 106 can be optimized for implementing an embodiment of the present invention in a multiple device embodiment with the first device 102. The second device 106 can provide the additional or higher performance processing power compared to the first device 102. The second device 106 can include a second control unit 234, a second communication unit 236, a second user interface 238, and a second storage unit 246.

The second user interface 238 allows a user (not shown) to interface and interact with the second device 106. The second user interface 238 can include an input device and an output device. Examples of the input device of the second user interface 238 can include a keypad, a touchpad, soft-keys, a keyboard, a microphone, or any combination thereof to provide data and communication inputs. Examples of the output device of the second user interface 238 can include a second display interface 240. The second display interface 240 can include a display, a projector, a video screen, a speaker, or any combination thereof.

The second control unit 234 can execute a second software 242 to provide the intelligence of the second device 106 of the computing system 100. The second software 242 can operate in conjunction with the first software 226. The second control unit 234 can provide additional performance compared to the first control unit 212.

The second control unit 234 can operate the second user interface 238 to display information. The second control unit 234 can also execute the second software 242 for the other functions of the computing system 100, including operating the second communication unit 236 to communicate with the first device 102 over the network 104.

The second control unit 234 can be implemented in a number of different manners. For example, the second control unit 234 can be a processor, an embedded processor, a microprocessor, hardware control logic, a hardware finite state machine (FSM), a digital signal processor (DSP), or a combination thereof.

The second control unit 234 can include a second control interface 244. The second control interface 244 can be used for communication between the second control unit 234 and other functional units in the second device 106. The second control interface 244 can also be used for communication that is external to the second device 106.

The second control interface 244 can receive information from the other functional units or from external sources, or can transmit information to the other functional units or to external destinations. The external sources and the external destinations refer to sources and destinations external to the second device 106.

The second control interface 244 can be implemented in different ways and can include different implementations depending on which functional units or external units are being interfaced with the second control interface 244. For example, the second control interface 244 can be implemented with a pressure sensor, an inertial sensor, a microelectromechanical system (MEMS), optical circuitry, waveguides, wireless circuitry, wireline circuitry, or a combination thereof.

A second storage unit 246 can store the second software 242. The second storage unit 246 can also store the information such as data representing incoming images, data representing previously presented image, sound files, or a combination thereof. The second storage unit 246 can be sized to provide the additional storage capacity to supplement the first storage unit 214.

For illustrative purposes, the second storage unit 246 is shown as a single element, although it is understood that the second storage unit 246 can be a distribution of storage elements. Also for illustrative purposes, the computing system 100 is shown with the second storage unit 246 as a single hierarchy storage system, although it is understood that the computing system 100 can have the second storage unit 246 in a different configuration. For example, the second storage unit 246 can be formed with different storage technologies forming a memory hierarchal system including different levels of caching, main memory, rotating media, or off-line storage.

The second storage unit 246 can be a volatile memory, a nonvolatile memory, an internal memory, an external memory, or a combination thereof. For example, the second storage unit 246 can be a nonvolatile storage such as non-volatile random access memory (NVRAM), Flash memory, disk storage, or a volatile storage such as static random access memory (SRAM).

The second storage unit 246 can include a second storage interface 248. The second storage interface 248 can be used for communication between the second storage unit 246 and other functional units in the second device 106. The second storage interface 248 can also be used for communication that is external to the second device 106.

The second storage interface 248 can receive information from the other functional units or from external sources, or can transmit information to the other functional units or to external destinations. The external sources and the external destinations refer to sources and destinations external to the second device 106.

The second storage interface 248 can include different implementations depending on which functional units or external units are being interfaced with the second storage unit 246. The second storage interface 248 can be implemented with technologies and techniques similar to the implementation of the second control interface 244.

The second communication unit 236 can enable external communication to and from the second device 106. For example, the second communication unit 236 can permit the second device 106 to communicate with the first device 102 over the network 104.

The second communication unit 236 can also function as a communication hub allowing the second device 106 to function as part of the network 104 and not limited to be an end point or terminal unit to the network 104. The second communication unit 236 can include active and passive components, such as microelectronics or resistors, for interaction with the network 104.

The second communication unit 236 can include a baseband device or component, a modem, a digital signal processor, or a combination thereof for transmitting, formatting, receiving, detecting, decoding, further processing, or a combination thereof for communication signals. The second communication unit 236 can include one or more portions for processing the voltages, the currents, the digital information, or a combination thereof, such as an analog-to-digital converter, a digital-to-analog converter, a filter, an amplifier, a processor-type circuitry, or a combination thereof. The second communication unit 236 can further include one or more portions for storing information, such as cache or RAM memory, registers, or a combination thereof.

The second communication unit 236 can be coupled with a second inter-device interface 237. The second inter-device interface 237 can be a device or a portion of a device for physically communicating signals with a separate device. The second inter-device interface 237 can communicate by transmitting or receiving signals to or from another device. The second inter-device interface 237 can include one or more antennas for wireless signals, a physical connection and receiver-transmitter for wired signals, or a combination thereof. The second inter-device interface 237 can include an omnidirectional antenna, a wire, an antenna chip, a ceramic antenna, or a combination thereof. The second inter-device interface 237 can further include a port, a wire, a repeater, a connector, a filter, a sensor, or a combination thereof.

The second inter-device interface 237 can detect or respond to a power in electromagnetic waves and provide the detected result to the second communication unit 236 to receive a signal, including the first device transmission 208. The second inter-device interface 237 can provide a path or respond to currents or voltages provided by the second communication unit 236 to transmit a signal, including the second device transmission 210.

The second communication unit 236 can include a second communication interface 250. The second communication interface 250 can be used for communication between the second communication unit 236 and other functional units in the second device 106. The second communication interface 250 can receive information from the other functional units or can transmit information to the other functional units.

The second communication interface 250 can include different implementations depending on which functional units are being interfaced with the second communication unit 236. The second communication interface 250 can be implemented with technologies and techniques similar to the implementation of the second control interface 244.

The first communication unit 216 can couple with the network 104 to send information to the second device 106 in the first device transmission 208. The second device 106 can receive information in the second communication unit 236 from the first device transmission 208 of the network 104.

The second communication unit 236 can couple with the network 104 to send information to the first device 102 in the second device transmission 210. The first device 102 can receive information in the first communication unit 216 from the second device transmission 210 of the network 104. The computing system 100 can be executed by the first control unit 212, the second control unit 234, or a combination thereof. For illustrative purposes, the second device 106 is shown with the partition having the second user interface 238, the second storage unit 246, the second control unit 234, and the second communication unit 236, although it is understood that the second device 106 can have a different partition. For example, the second software 242 can be partitioned differently such that some or all of its function can be in the second control unit 234 and the second communication unit 236. Also, the second device 106 can include other functional units not shown in FIG. 2 for clarity.

The functional units in the first device 102 can work individually and independently of the other functional units. The first device 102 can work individually and independently from the second device 106 and the network 104.

The functional units in the second device 106 can work individually and independently of the other functional units. The second device 106 can work individually and independently from the first device 102 and the network 104.

The functional units described above can be implemented in hardware. For example, one or more of the functional units can be implemented using the a gate, circuitry, a processor, a computer, integrated circuit, integrated circuit cores, a pressure sensor, an inertial sensor, a microelectromechanical system (MEMS), a passive device, a physical non-transitory memory medium having instructions for performing the software function, a portion therein, or a combination thereof.

For illustrative purposes, the computing system 100 is described by operation of the first device 102 and the second device 106. It is understood that the first device 102 and the second device 106 can operate any of the modules and functions of the computing system 100.

Figure 3:
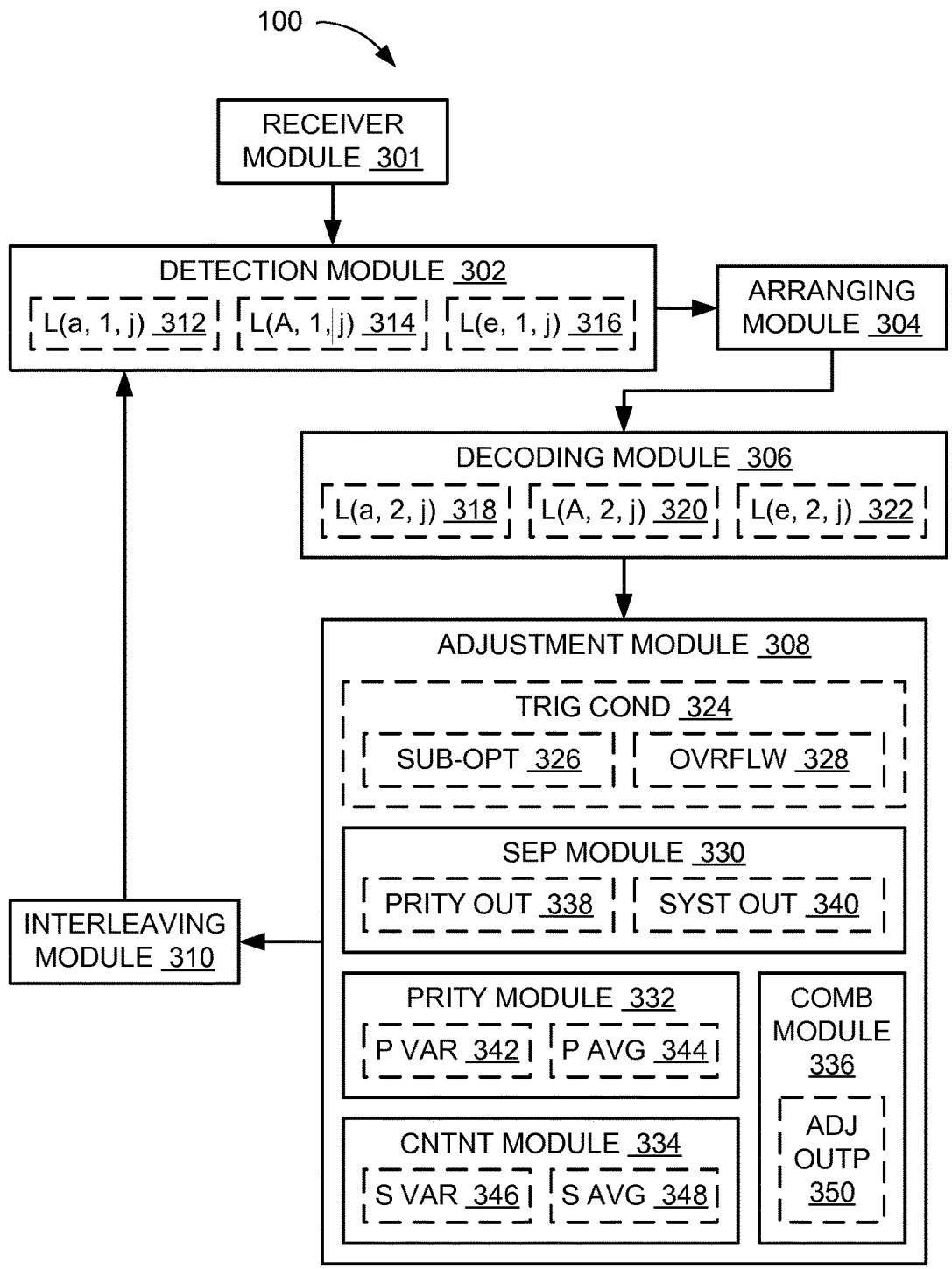
FIG. 3 is a control flow of the computing system.

Referring now to FIG. 3, therein is shown a control flow of the computing system 100. The computing system 100 can include a receiver module 301, a detection module 302, an arranging module 304, a decoding module 306, an adjustment module 308, an interleaving module 310, or a combination thereof.

The receiver module 301 can be coupled with the detection module 302, and the detection module 302 can be coupled with the arranging module 304, which can be further coupled with the decoding module 306. The decoding module 306 can be coupled with the adjustment module 308, which can be further coupled to the interleaving module 310. The interleaving module 310 can be further coupled to the detection module 302.

The modules can be coupled to each other in a variety of ways. For example, modules can be coupled by having the input of one module connected to the output of another, such as by using wired or wireless connections, the network 104 of FIG. 1, instructional steps, process sequence, or a combination thereof. Also for example, the modules can be coupled either directly with no intervening structure other than connection means between the directly coupled modules, or indirectly with modules or devices other than the connection means between the indirectly coupled modules.

As a more specific example, one or more inputs or outputs of the detection module 302 can be directly connected to one or more inputs or outputs of the arranging module 304 using conductors or the transmission channel without intervening modules or devices there-between. Also as a more specific example, the detection module 302 and the arranging module 304 can be coupled indirectly using a repeater, a switch, a routing device, or a combination thereof there-between. The receiver module 301, the arranging module 304, the decoding module 306, the adjustment module 308, the interleaving module 310, or a combination thereof can be coupled directly or indirectly in similar ways.

The computing system 100 can communicate with or using a device, such as by displaying images, recreating sounds, exchanging process steps or instructions, or a combination thereof. The computing system 100 can communicate information between devices. The receiving device can further communicate with the user by displaying images, recreating sounds, exchanging process steps or instructions, or a combination thereof according to the information communicate to the device.

The detection module 302, the arranging module 304, the decoding module 306, the adjustment module 308, the interleaving module 310, or a combination thereof can be for implementing the receiver processing mechanism 138 of FIG. 1, the iterative detection-decoding mechanism 140 of FIG. 1, or a combination thereof. The detection module 302, the arranging module 304, the decoding module 306, the adjustment module 308, the interleaving module 310, or a combination thereof can further include interference-aware receiver 142 of FIG. 1, the multiple stream receiver 146 of FIG. 1, the turbo receiver 148 of FIG. 1, or a combination thereof. The first device 102 of FIG. 1, the second device 106 of FIG. 1, or a combination thereof can include the device profile 136 of FIG. 1 describing the detection module 302, the arranging module 304, the decoding module 306, the adjustment module 308, the interleaving module 310, or a combination thereof as predetermined or detected by the computing system 100.

The receiver module 301 is configured to receive the receiver signal 124 of FIG. 1. The receiver module 301 can receive the receiver signal 124 corresponding to and representing the serving signal 116 of FIG. 1, the base stream 120 of FIG. 1, the additional stream 128 of FIG. 1, or a combination thereof.

The receiver module 301 can receive the receiver signal 124 as serving signal 116, the base stream 120, the additional stream 128, or a combination thereof having respectively traversed the serving channel, the additional channel, or a combination thereof. The receiver module 301 can receive the receiver signal 124 corresponding to the code word 110 including the systematic information 112 of FIG. 1 and the parity information 114 of FIG. 1 for representing the serving signal 116 including the systematic information 112 and the parity information 114.

The receiver module 301 can receive the receiver signal 124 by recording electrical power, voltage, current, or a combination thereof. For example, the receiver module 301 can receive the receiver signal 124 by recording energy levels or changes therein for the first inter-device interface 217 of FIG. 2, the second inter-device interface 237 of FIG. 2, the first communication interface 228 of FIG. 2, the second communication interface 250 of FIG. 2, the first control interface 222 of FIG. 2, the second control interface 244 of FIG. 2, or a combination thereof.

Also for example, the receiver module 301 can receive the receiver signal 124 by recording energy levels or changes received through a wireless antenna, a wire or a conductor, an instruction or a step for transferring data between devices, processes, instructions, between portions therein, or a combination thereof. Also for example, the receiver module 301 can record the receiver signal 124 by storing the energy levels or changes therein, according to a time, a sequence, or a combination thereof in the first communication unit 216 of FIG. 2, the second communication unit 236 of FIG. 2, the first storage unit 214 of FIG. 2, the second storage unit 246 of FIG. 2, or a combination thereof.

The receiver module 301 can process the receiver signal 124 to determine aspects thereof. For example, the receiver module 301 can determine a sample size, a sample index, the reference portion 118 of FIG. 1 for the base stream 120 or the additional stream 128, the noise portion, or a combination thereof. The receiver module 301 can recognize based on a method or a process predetermined by the computing system 100 or a standard for controlling a sampling rate, a block size, a symbol size, or a combination thereof.

The receiver module 301 can further use a dedicated device, circuitry, process, or a combination thereof to determine the aspects of the receiver signal 124 including the noise measure 134 of FIG. 1. The receiver module 301 can also use known parts or aspects of the receiver signal to further identify appropriate instance of the values for other aspects as predetermined and stored by the computing system 100. The receiver module 301 can further determine the noise measure 134 of FIG. 1 using a statistical analysis based on the noise portion, based on values predetermined by the computing system 100, or a combination thereof.

The receiver module 301 can determine the aspects of the receiver signal 124 using the first communication unit 216, the second communication unit 236, the first control unit 212 of FIG. 2, the second control unit 234 of FIG. 2, or a combination thereof. The receiver module 301 can store the aspects of the receiver signal 124 in the first communication unit 216, the second communication unit 236, the first storage unit 214, the second storage unit 246, or a combination thereof.

The receiver module 301 can further characterize communication channels. For example, the receiver module 301 can determine the serving channel estimate 126 of FIG. 1, the additional channel estimate 130 of FIG. 1, or a combination thereof.

The receiver module 301 can use the reference portion 118 associated with the base stream 120, the additional stream 128, a portion in the receiver signal 124 corresponding thereto, or a combination thereof to determine the serving channel estimate 126, the additional channel estimate 130, or a combination thereof. The details, formats, requirements, or a combination thereof regarding the reference portion 118, such as regarding original frequency, phase, content, shape, or a combination thereof, can be predetermined by the communication standard, the computing system 100, or a combination thereof.

The receiver module 301 can compare the received instances of the receiver signal 124 or segments therein to the predetermined parameters for the reference portion 118. The receiver module 301 can further use frequency domain transformation or time domain transformation, convolution, transposition, basic mathematical operations, or a combination thereof with the predetermined or received instances of the reference communication, or both.

The receiver module 301 can further calculate the changes in magnitude, frequency, phase, or a combination thereof in the reference portion in the base stream 120, the additional stream 128, or a combination thereof to the receiver signal 124. The receiver module 301 can further use various methods, such as the least square method, the least mean square (LMS) method, or the minimum mean square error (MMSE) method, to determine the serving channel estimate 126, the additional channel estimate 130, or a combination thereof.

The receiver module 301 can use the first communication unit 216, the second communication unit 236, the first control unit 212, the second control unit 234, or a combination thereof to determine the serving channel estimate 126, the additional channel estimate 130, or a combination thereof. The receiver module 301 can store the serving channel estimate 126, the additional channel estimate 130, or a combination thereof in the first communication unit 216, the second communication unit 236, the first storage unit 214, the second storage unit 246, or a combination thereof.

After receiving the receiver signal 124 and determining the aspects thereof, the control flow can pass to the detection module 302. The control flow can pass through a variety of ways. For example, control flow can pass by having processing results of one module passed to another module, such as by passing the receiver signal 124, the determined aspects thereof, or a combination thereof from the receiver module 301 to the detection module 302, by storing the processing results at a location known and accessible to the other module, such as by storing the receiver signal 124, the determined aspects thereof, or a combination thereof at a storage location known and accessible to the detection module 302, by notifying the other module, such as by using a flag, an interrupt, a status signal, or a combination for the detection module 302, or a combination of processes thereof.

The detection module 302 is configured to recognize contents of the receiver signal 124. The detection module 302 can detect symbol level information, the code word 110 of FIG. 1, bit level information, or a combination thereof in the receiver signal 124. The detection module 302 can detect information in the receiver signal 124 corresponding to the base stream 120, the additional stream 128, or a combination thereof.

The detection module 302 can include the interference aware detector for recognizing and processing both serving data and interference data. The detection module 302 can further include the point-to-point detector or the MIMO detector. The detection module 302 can implement a turbo principle mechanism, such as for the turbo receiver 148. The detection module 302 can further include a joint detector for detecting both serving signal and interference signal.

The detection module 302 can detect the receiver signal 124 based on a detector a-priori data 312. The detector a-priori data 312 can be a prior knowledge for the detection module 302 about the serving content 108 of FIG. 1, the base stream 120, the additional stream 128, the code word 110, the receiver signal 124, a symbol therein, a bit therein, or a combination thereof.

The detector a-priori data 312 can be one or more measures of confidence levels associated with a likely transmitted symbol or likelihoods for all possible symbols, or the associated bit values, corresponding to the analyzed portion in the receiver signal 124. The detector a-priori data 312 can be a log likelihood ratio (LLR).

The detector a-priori data 312 can be based on:

$$L_{n,m}^{(a,1,k)} = \log \frac{P(b_{n,m}^k = +1)}{P(b_{n,m}^k = -1)}.$$

Equation (2).

The detector a-priori data 312 can be expressed as '$L_{n,m}^{(a,1,1)}$'. The detector a-priori data 312 can correspond to 'n'th symbol and the 'm'th bit at an instance of the code word 110. The notation 'a' in the superscript can represent a-priori value. The '1' in the superscript can represent the detection module 302. The term 'k' in the superscript can represent processing of the serving content or the interference content for the interference-aware receiver 142 or represent an index for instances of the code word 110 for the point-to-point receiver 144 of FIG. 1.

The detector a-priori data 312 can be a logarithmic result of a ratio between a probability that a certain bit or symbol within the receiver signal 124 had a transmitted value of +1 and a different probability that the same bit or symbol had a transmitted value of −1 or 0.

The detection module 302 can determine a value resulting from a module external to the detection module 302, such as the decoding module 306, the adjustment module 308, the interleaving module 310, or a combination thereof as the detector a-priori data 312. The detection module 302 can also determine a value resulting from a previous iteration in determining the serving content 108 as the detector a-priori data 312.

For an initial iteration, the detection module 302 can use an initial value for the detector a-priori data 312. For example, the detection module 302 can initialize the detector a-priori data 312 as 0, 1, NULL, a value predetermined by the computing system 100, externally supplied value, or a combination thereof.

The detection module 302 can detect the receiver signal 124 by calculating a detector a-posteriori data 314. The detector a-posteriori data 314 can be a later knowledge for the detection module 302 about the serving content 108, the base stream 120, the additional stream 128, the code word 110, the receiver signal 124, a symbol therein, a bit therein, or a combination thereof. The detector a-posteriori data 314 can be one or more measures of confidence levels associated with a likely transmitted symbol or likelihoods for all possible symbols, or the associated bit values, corresponding to an analyzed portion in the receiver signal 124. The detector a-posteriori data 314 can be a LLR.

The detection module 302 can calculate the detector a-posteriori data 314 according to:

$$L_{n,m}^{(A,1,1)} = \log \frac{P(b_{n,m}^1 = +1 \mid y)}{P(b_{n,m}^1 = -1 \mid y)}.. \qquad \text{Equation (3)}$$

The detector a-posteriori data 314 can be a logarithmic result of a ratio between a probability that a certain bit or symbol within the receiver signal 124 had a transmitted value of +1 given the receiver signal 124 and a different probability that the same bit or symbol had a transmitted value of −1 or 0 given the receiver signal 124.

The detection module 302 can further calculate and approximate the detector a-posteriori data 314 based on:

$$L_{n,m}^{(A,1,1)} = \log \frac{\sum\limits_{b^1 \in \{b_{n,j}^1 = +1\}, b^2} P\left(\frac{1}{2}b^1 L_n^{(a,1,1)} + \frac{1}{2}b^2 L_n^{(a,1,2)}\right)}{\sum\limits_{b^1 \in \{b_{n,j}^1 = -1\}, b^2} P(y \mid b^1 b^2)} \approx$$

$$P\left(\frac{1}{2}b^1 L_n^{(a,1,1)} + \frac{1}{2}b^2 L_n^{(a,1,2)}\right)$$

$$\max_{\overline{\theta} \in \{b_{n,j}^1 = +1\}, b^2} \left(-\frac{1}{\sigma_n^2} \left\| y - \sqrt{P_1} H^1 \overline{\theta}^1 + \sqrt{P_2} H^2 x^2 \right\| + \frac{1}{2} b^1 L_n^{(a,1,1)} + \frac{1}{2} b^2 L_n^{(a,1,2)}\right) -$$

$$\max_{\overline{\theta} \in \{b_{n,j}^1 = -1\}, b^2} \left(-\frac{1}{\sigma_n^2} \left\| y - \sqrt{P_1} H^1 \overline{\theta}^1 + \sqrt{P_2} H^2 x^2 \right\| + \frac{1}{2} b^1 L_n^{(a,1,1)} + \frac{1}{2} b^2 L_n^{(a,1,2)}\right). \qquad \text{Equation (4)}$$

The detector a-posteriori data 314 can be represented as '$L_{n,m}^{(A,1,1)}$'. The superscript can be similar to the detector a-priori data 312 with 'A' representing a-posteriori value and last '1' representing the serving signal 116, the serving content 108, a preceding instance of the code word 110, a portion of the code word 110, or a combination thereof.

The term '$b_{n,m}^1$' can represent a bipolar bit for the 'n'th symbol and the 'm'th bit at an instance of the code word 110.

The 'b' and 'L' can indicate the vector corresponding to the 'n'th symbol and the code word 110. The term 'j' can represent an iteration index, such as for the j'th instance of the code word 110.

The detection module 302 can further calculate a detector extrinsic data 316. The detector extrinsic data 316 can be based on the detector a-priori data 312 and the detector a-posteriori data 314. The detector extrinsic data 316 can be based on:

$$L_{n,m}^{(ext,1,1)} = L_{n,m}^{(A,1,k)} - L_{n,m}^{(a,1,1)}. \qquad \text{Equation (5)}$$

The detector extrinsic data 316 can be represented as '$L_{n,m}^{(ext,1,1)}$'.

The detection module 302 can use the first communication unit 216, the second communication unit 236, the first control unit 212, the second control unit 234, or a combination thereof to detect the receiver signal 124. The detection module 302 can store the receiver signal 124, processing result thereof, such as the detector extrinsic data 316 or the detector a-posteriori data 314, or a combination thereof in the first communication unit 216, the second communication unit 236, the first storage unit 214, the second storage unit 246, or a combination thereof.

After detecting the receiver signal 124, the control flow can be passed from the detection module 302 to the arranging module 304. The control flow can pass similarly as described above between the receiver module 301 and the detection module 302 but using processing results of the detection module 302, such as the receiver signal 124, processing result thereof including the detector extrinsic data 316 or the detector a-posteriori data 314, or a combination thereof.

The arranging module 304 is configured to rearrange the receiver signal 124 or processing results corresponding thereto. The arranging module 304 can de-interleave the receiver signal 124, the detector extrinsic data 316, the detector a-posteriori data 314, or a combination thereof.

The arranging module 304 can de-interleave based on a method or a process predetermined by the computing system 100, a communication standard, a coding mechanism, or a combination thereof. For example, the arranging module 304 can arrange the receiver signal 124, the detector extrinsic data 316, the detector a-posteriori data 314, or a combination thereof according to the turbo coding scheme or the polar coding scheme. As a more specific example, the arranging module 304 can de-interleave such as for the turbo receiver 148.

After de-interleaving, the control flow can be passed from the arranging module 304 to the decoding module 306. The control flow can pass similarly as described above between the receiver module 301 and the detection module 302 but using processing results of the arranging module 304, such as de-interleaved instance of the receiver signal 124, the detector extrinsic data 316, the detector a-posteriori data 314, or a combination thereof.

The decoding module 306 is configured to decode the receiver signal 124. The decoding module 306 can decode for the serving signal 116, the serving content 108, the code word 110, or a combination thereof.

The decoding module 306 can decode based on a decoder a-priori data 318. The decoder a-priori data 318 can be can be a prior knowledge for the decoding module 306 about the serving content 108, the base stream 120, the additional stream 128, the receiver signal 124, a symbol therein, a bit therein, or a combination thereof.

The decoder a-priori data 318 can be expressed as '$L_{n,m}^{(a,2,1)}$'. The '2' in the superscript can represent the decoding module 306.

The decoder a-priori data 318 can be similar to the detector a-priori data 312, but for the decoding module 306 instead of the detection module 302. For example, the decoder a-priori data 318 can be one or more measures of confidence levels, a LLR value, or a combination thereof.

The decoding module 306 can use the decoder a-priori data 318 based on Equation (2). The decoding module 306 can use the de-interleaved instance of the receiver signal 124, the detector a-posteriori data 314, the detector extrinsic data 316, or a combination thereof as the decoder a-priori data 318.

The decoding module 306 can calculate a decoder a-posteriori data 320, a decoder extrinsic data 322, or a combination thereof as a decoding result based on decoding the receiver signal 124 or a derivation thereof resulting from the arranging module 304. The decoder a-posteriori data 320 can be a later knowledge for the decoding module 306 about the serving content 108, the base stream 120, the additional stream 128, the code word 110, the receiver signal 124, a symbol therein, a bit therein, or a combination thereof. The decoder a-posteriori data 320 can be expressed as '$L_{n,m}^{(A,2,1)}$'.

The decoder a-posteriori data 320 can be one or more measures of confidence levels associated with a likely transmitted symbol or likelihoods for all possible symbols, or the associated bit values, corresponding to an analyzed portion in the receiver signal 124. The detector a-posteriori data 314 can be a LLR.

The decoder a-posteriori data 320 can be similar to the detector a-posteriori data 314, but for the decoding module 306 instead of the detection module 302. For example, the decoder a-posteriori data 320 can be one or more measures of confidence levels, a LLR value, or a combination thereof. Also for example, the decoding module 306 can calculate the decoder a-posteriori data 320 based on Equations (3)-(4), but from the perspective of the decoding module 306 instead of the detection module 302.

The decoding module 306 can calculate the decoder extrinsic data 322. The decoder extrinsic data 322 can be based on the decoder a-priori data 318 and the decoder a-posteriori data 320. The decoder extrinsic data 322 can be based on Equation (5), but for the decoding module 306 instead of the detection module 302.

The decoding module 306 can decode using the first communication unit 216, the second communication unit 236, the first control unit 212, the second control unit 234, or a combination thereof. The decoding module 306 can further store the decoding result, such as the decoder extrinsic data 322 or the decoder a-posteriori data 320, the receiver signal 124, or a combination thereof in the first communication unit 216, the second communication unit 236, the first storage unit 214, the second storage unit 246, or a combination thereof.

After decoding, the control flow can be passed from the decoding module 306 to the adjustment module 308. The control flow can pass similarly as described above between the receiver module 301 and the detection module 302 but using the decoding output of the decoding module 306, such as the decoder extrinsic data 322, the decoder a-posteriori data 320, or a combination thereof.

The adjustment module 308 is configured to adjust the decoding output in processing for the serving content 108 or the code word 110 from the receiver signal 124. The adjustment module 308 can adjust by generating the parity portion adjustment 152 of FIG. 1, the systematic portion adjustment 154 o FIG. 1, or a combination thereof.

The adjustment module 308 can generate the parity portion adjustment 152 corresponding to the parity information 114 of the code word 110, the systematic portion adjustment 154 corresponding to the systematic information 112 of the code word 110, or a combination thereof for adjusting the decoding output. For example, the parity portion adjustment 152 can be for adjusting information or result associated with or resulting from processing the parity information 114. Also for example, the systematic portion adjustment 154 can be for adjusting information or result associated with or resulting from processing the systematic information 112.

The adjustment module 308 can generate the parity portion adjustment 152, the systematic portion adjustment 154, or a combination thereof based on a trigger condition 324. The trigger condition 324 can be a representation of a situation or a condition for adjusting the decoding output, such as the decoder a-posteriori data 320 or the decoder extrinsic data 322. The trigger condition 324 can indicate the condition or the situation where a mismatch effect for the signal-to-noise ratio (SNR) can be adjusted or accounted for in processing for the serving content 108 or the code word 110.

The trigger condition 324 can determine the trigger condition 324 for adjusting the decoding output based on control information communicated between the first device 102 and the second device 106, the serving channel estimate 126, the additional channel estimate 130, the receiver capacity 132 of FIG. 1, the transmission capacity 122 of FIG. 1, the device profile 136, or a combination thereof. The trigger condition 324 can include a sub-optimal status 326, an overflow status 328, or a combination thereof.

The sub-optimal status 326 is an indication of a condition or a situation for adjusting the decoding output where the performance of the receiving device is below optimal or below a threshold predetermined by the computing system 100. The sub-optimal status 326 can indicate the condition or the situation where the degradation caused by the sub-optimality of the receiver processing mechanism 138 can be compensated.

The adjustment module 308 can determine the sub-optimal status 326 based on the device profile 136, the receiver processing mechanism 138 therein, or a combination thereof. For example, the adjustment module 308 can include a determination of the sub-optimal status 326 corresponding to various known instances of the device profile 136, the receiver processing mechanism 138 therein, or a combination thereof. Also for example, the adjustment module 308 can include an instance of the sub-optimal status 326 predetermined or assigned by the computing system 100, the device manufacturer of the first device 102 or the second device 106, or a combination thereof according to the device profile 136, the receiver processing mechanism 138 therein, or a combination thereof corresponding thereto.

The overflow status 328 is a condition or a situation for adjusting the decoding output where the additional stream 128 is included in the receiver signal 124. The overflow status 328 can include the condition or the situation where the receiver capacity 132 is less than or equal to the transmission capacity 122. The overflow status 328 can represent a rank-deficient condition for communicating the serving signal 116.

For example, the overflow status 328 can include the point-to-point receiver 144 in the rank-deficient condition with the receiver capacity 132 equal to or less than the transmission capacity 122. The overflow status 328 can be based on the additional stream 128 included in the serving signal 116 and transmitted by the second device 106. Also for example, the overflow status 328 can include the multiple stream receiver 146 communicating at full rank and receiving the additional stream 128 from an interference source intended for communication with a different device.

The adjustment module 308 can determine the overflow status 328 based on the device profile 136, control or identification information exchanged between communicating devices, the serving channel estimate 126, the additional channel estimate 130, or a combination thereof. For example, the adjustment module 308 can determine the overflow status 328 based on the point-to-point receiver 144, the multiple stream receiver 146, independent instances of the reference portion 118 in the receiver signal 124, the transmission capacity 122 communicated through header information or separate control or physical channel or layer, the receiver capacity 132, or a combination thereof.

The adjustment module 308 can further determine the trigger condition 324 for adjusting the decoding output based on variety of information. For example, the adjustment module 308 can determine the trigger condition 324 based on the interference-aware receiver 142, the turbo receiver 148, the iterative detection-decoding mechanism 140, or a combination thereof. Also for example, the adjustment module 308 can determine the trigger condition 324 based on modulation order, decoding gain, or a combination thereof as indicated by the control information or channel estimations.

The adjustment module 308 can adjust the decoder output based on determining the trigger condition 324 corresponding to the overflow status 328, the sub-optimal status 326, or a combination thereof associated with the receiver signal. The adjustment module 308 can further use a separation module 330, a parity module 332, a content module 334, a combining module 336, or a combination thereof to adjust the decoding output.

It has been discovered that the trigger condition 324, the parity portion adjustment 152, and the systematic portion adjustment 154 provides increased communication throughput. The trigger condition 324 can determine conditions or situations where separately adjusting the decoding output with the parity portion adjustment 152 and the systematic portion adjustment 154 can reduce negative effects of SNR mismatch, which can reduce processing errors.

The separation module 330 is configured to decompose and divide the decoding output according to the systematic information 112 and the parity information 114. The separation module 330 can decompose and divide for generating the output adjustment 150 of FIG. 1. The adjustment module 308 can generate a parity output portion 338, a systematic output portion 340, or a combination thereof based decomposing and dividing the decoding output, such as the decoder a-posteriori data 320 or the decoder extrinsic data 322, corresponding to the systematic information 112 and the parity information 114.

The decoding output, as exemplified by the decoder extrinsic data 322, can be represented as:

$$L^{(ext,2,j)} = [\alpha L^{(ext,2,j)}_{sys.}, \beta L^{(ext,2,j)}_{par.}].$$ Equation (6).

The systematic output portion 340 can be represented as '$L^{(ext,2,j)}_{sys.}$' and the parity output portion 338 can be represented as '$L^{(ext,2,j)}_{par.}$'. The parity portion adjustment 152 can be represented as '$\beta$' and the systematic portion adjustment 154 can be represented as '$\alpha$'.

The separation module 330 can decompose and divide based on format or structure of the code word 110 as predetermined by the computing system 100, a standard, a coding scheme, or a combination thereof. For example, the separation module 330 can decompose and divide based on relative locations or order of the information, represented bits, a processing or communication sequence, or a combination thereof.

The separation module 330 can decompose and divide the decoding output by identifying LLR values according to correspondence or association with the systematic information 112, the parity information 114 or a combination thereof. For example, the separation module 330 can generate a parity output data 338, a systematic output data 340, or a combination thereof.

The separation module 330 can generate the parity output data 338 as the decoding output corresponding to or associated with the parity information 114. For example, the separation module 330 can generate the parity output data 338 as the processing results, such as the likelihood value or the soft information, corresponding to bits or portions designated for the parity information 114 of the code word 110.

The separation module 330 can similarly generate the systematic output data 340 as the decoding output corresponding to or associated with the systematic information 112. For example, the separation module 330 can generate the systematic output data 340 as the processing results, such as the likelihood value or the soft information, corresponding to bits or portions designated for the systematic information 112 of the code word 110.

The parity module 332 is configured to generate the parity portion adjustment 152. The parity module 332 can generate the parity portion adjustment 152 for adjusting the decoding output, such as the decoder a-posteriori data 320, the decoder extrinsic data 322, or a combination thereof.

The parity module 332 can generate the parity portion adjustment 152 corresponding to the parity output portion 338 as resulting from the separation module 330. The parity module 332 can generate the parity portion adjustment 152 for adjusting the parity output portion 338 of the decoding output. The parity module 332 can include a static value predetermined by the computing system 100 as the parity portion adjustment 152.

The parity module 332 can also dynamically generate the parity portion adjustment 152 according to the condition or the situation concurrent with or for the receiver signal 124. The parity module 332 can generate the parity portion adjustment 152 based on the adjustment selection factor 158 of FIG. 1.

Also for example, the parity module 332 can generate the parity portion adjustment 152 corresponding to the channel type, the system parameter, the Doppler value, or a combination thereof. The parity module 332 can compare the values in the device profile 136, the control information, the serving channel estimate 126, the additional channel estimate 130, or a combination thereof according to a value for the parity portion adjustment 152.

Continuing with the example, the adjustment selection factor 158 can identify specific information, values thereof, a corresponding value for the parity portion adjustment 152, or a combination thereof predetermined by the computing system 100. The adjustment selection factor 158 can include a table or an equation predetermined by the computing system 100 for implementing the adjustment selection factor 158 and generating the parity portion adjustment 152.

The parity module 332 can further utilize a parity variance measure 342. The parity variance measure 342 can be a statistical measurement regarding the parity output data 338, the parity information 114, or a combination thereof. The parity module 332 can utilize the parity variance measure 342 including a variance measurement or a covariance for the parity output data 338, the parity information 114, or a combination thereof.

The parity module 332 can calculate a parity average measure 344. The parity average measure 344 is an average value for the parity output data 338, the parity information 114, or a combination thereof. The parity module 332 can utilize the parity average measure 344 for representing the parity variance measure 342. The parity module 332 can calculate the parity average measure 344 associated with the parity variance measure 342 for representing the parity information 114 for the receiver signal 124.

The content module 334 is configured to generate the systematic portion adjustment 154. The content module 334 can generate the systematic portion adjustment 154 for adjusting the decoding output, such as the decoder a-posteriori data 320, the decoder extrinsic data 322, or a combination thereof. The content module 334 can be similar to the parity module 332 but for the systematic information 112.

The content module 334 can generate the systematic portion adjustment 154 corresponding to the systematic output portion 340 as resulting from the separation module 330. The content module 334 can generate the systematic portion adjustment 154 for adjusting the systematic output portion 340 of the decoding output.

The content module 334 can dynamically generate the systematic portion adjustment 154 according to the condition or the situation concurrent with or for the receiver signal 124. The content module 334 can generate the systematic portion adjustment 154 based on the parity variance measure 342, the parity average measure 344, the adjustment criterion 156 of FIG. 1, the parity portion adjustment 152, or a combination thereof.

For example, the content module 334 can generate the systematic portion adjustment 154 according to or satisfying the adjustment criterion 156 of maintaining same average between the systematic information 112 and the parity information 114 in processing for the code word 110 from the receiver signal 124. The content module 334 can generate the systematic portion adjustment 154 according to or satisfying the adjustment criterion 156 for balancing the decoding output for the systematic information 112 and the parity information 114. The content module 334 can accordingly represent a systematic variance measure 346 with a calculation of a systematic average measure 348.

Also for example, the content module 334 can generate the systematic portion adjustment 154 based on the adjustment selection factor 158 for characterizing the receiver signal 124. The content module 334 can generate the systematic portion adjustment 154 based on the adjustment selection factor 158 by utilizing the parity portion adjustment 152 generated based on the adjustment selection factor 158

The systematic variance measure 346 can be can be a statistical measurement, including a variance measurement or a covariance, regarding the systematic output data 340, the systematic information 112, or a combination thereof. The systematic variance measure 346 can be similar to the parity variance measure 342 but for the systematic output data 340, the systematic information 112, or a combination thereof.

The systematic average measure 348 is an average value for the systematic output data 340, systematic parity information 114, or a combination thereof. The content module 334 can utilize the systematic average measure 348 for representing the systematic variance measure 346. The content module 334 can calculate the systematic average measure 348 associated with the systematic variance measure 346 for representing the systematic information 112 for the receiver signal 124.

The content module 334 can use the systematic average measure 348 for generating the systematic portion adjustment 154 according to the adjustment criterion 156. The adjustment criterion 156 can be represented as:

$$\alpha \overline{L^{(ext,2,j)}}_{sys.} = \beta \overline{L^{(ext,2,j)}}_{par.} \qquad \text{Equation (7)}.$$

The systematic average measure 348 can be represented as '$\overline{L^{(ext,2,j)}}_{sys.}$', and the parity average measure 344 can be represented as '$\overline{L^{(ext,2,j)}}_{par.}$'. Accordingly, the content module 334 can calculate the systematic average measure 348 according to the adjustment criterion 156 by dividing the parity average measure 344, the parity portion adjustment 152, or a combination thereof by the systematic average measure 348. The content module 334 can generate the systematic portion adjustment 154 together with the parity portion adjustment 152 according to or satisfying the adjustment criterion 156 for balancing the decoding output for the systematic information 112 and the parity information 114.

The content module 334 can also generate the systematic portion adjustment 154 according to a static value predetermined by the computing system 100 or based on the adjustment selection factor 158. The content module 334 can generate the systematic portion adjustment 154 similar to the parity module 332 generating the parity portion adjustment 152 based on the adjustment selection factor 158. The content module 334 can include a table, an equation, or a combination thereof unique for the systematic portion adjustment 154. The content module 334 can generate the systematic portion adjustment 154 same as or different from the parity portion adjustment 152.

The content module 334 can further generate the systematic portion adjustment 154 based on the systematic variance measure 346 and the parity variance measure 342. The content module 334 can generate the systematic portion adjustment 154 scaled based on the systematic variance measure 346 and the parity variance measure 342. For example, the content module 334 can generate the systematic portion adjustment 154 as $$\frac{\mu_{par.}}{\mu_{sys.}} \beta'.$$

The systematic variance measure 346 can be represented as '$\mu_{sys.}$' and the parity variance measure 342 can be represented as '$\mu_{par.}$'.

It has been discovered that the systematic average measure 348 and the parity average measure 344 instead of the systematic variance measure 346 and the parity variance measure 342 provides reduction in computational complexity while reducing effects of SNR mismatch. The mutual information can decrease if both variances of systematic and parity bits starts to deviate. By the consistency condition, $\mu = \sigma^2/2$, the variance of the LLR sequence can be directly proportional to the average of the sequence. Moreover, the average calculation can be performed using mechanisms having simpler order and computational complexity or power than variance or covariance calculations.

The adjustment module 308 can use the parity module 332 and the content module 334 to generate the parity portion adjustment 152 and the systematic portion adjustment 154 according to the adjustment criterion 156 for balancing the parity average measure 344 and the systematic average measure 348 as described above. The adjustment module 308 can use the parity module 332 and the content module 334 to further generate the parity portion adjustment 152 and the systematic portion adjustment 154 according to the adjustment criterion 156 for balancing the decoding output for the systematic information 112 and the parity information 114.

It has been discovered that the systematic portion adjustment 154 and the parity portion adjustment 152 provides improved communication efficiency. The systematic portion adjustment 154 and the parity portion adjustment 152 can specifically adjust for the systematic information 112 and the parity information 114, each having unique sizes and purposes. The targeted adjustment can improve and amplify the unique purposes of each portion during processing of the receiver signal 124 instead of using one static value.

It has further been discovered that dynamically generating the systematic portion adjustment 154 and the parity portion adjustment 152 based on the adjustment selection factor 158 provides improved flexibility. The computing system 100 can adjust the LLR values specific to current and relevant situations using the dynamically generated instances of the systematic portion adjustment 154 and the parity portion adjustment 152 based on the adjustment selection factor 158.

The adjustment module 308 can use the combining module 336 to implement the balancing. The combining module 336 is configured to apply the parity portion adjustment 152, the systematic portion adjustment 154, or a combination thereof to the decoding output. The combining module 336 can apply the parity portion adjustment 152, the systematic portion adjustment 154, or a combination thereof for determining the serving signal 116, the code word 110, the serving content 108, or a combination thereof from the receiver signal 124.

The combining module 336 can apply by combining the parity portion adjustment 152 with the parity output data 338, the systematic portion adjustment 154 with the systematic output data 340, or a combination thereof. The combining module 336 can combine using mathematical processes, such as adding, multiplying, negating, using exponential relationship, or a combination thereof.

The combining module 336 can further generate an adjusted output 350. The adjusted output 350 is a processing value including the parity portion adjustment 152, the systematic portion adjustment 154, or a combination thereof for replacing the decoding output. The combining module 336 can generate the adjusted output 350 by combining the portions corresponding to the systematic information 112 with portions corresponding to the parity information 114.

For example, the combining module 336 can combine a parity result from combining the parity portion adjustment 152 with the parity output data 338 together with a systematic result from combining the systematic portion adjustment 154 with the systematic output data 340. Also for example, the combining module 336 can combine the parity result with the systematic output data 340 or combine the systematic result with the parity output data 338.

The combining module 336 can generate the adjusted output 350 for replacing the decoding output in the turbo receiver 148, the iterative detection-decoding mechanism 140, or a combination thereof. The combining module 336 can generate the adjusted output 350 as a set of LLR values of the decoding output adjusted specifically for a portion corresponding to the systematic information 112 with the systematic portion adjustment 154, a portion corresponding to the parity information 114 with the parity portion adjustment 152, or a combination thereof.

It has been discovered that the adjusted output 350 provides improved communication throughput. The systematic bits and the parity bits can be separately considered using the parity output data 338 and the systematic output data 340, and separately adjusted using the systematic portion adjustment 154, the parity portion adjustment 152, or a combination thereof. The separate consideration and adjustment can alleviate effects of the SNR mismatch, which can improve processing errors and processing iterations.

It has been further discovered that the systematic portion adjustment 154 specifically adjusting the systematic output data 340 of the decoding output provides reduced communication error and retransmission requests. The specific adjustments can improve and amplify the unique purposes of each portion during processing of the receiver signal 124 according to the purpose or nature of the information.

It has been further discovered that the parity portion adjustment 152 specifically adjusting the parity output data 338 of the decoding output provides reduced communication error and retransmission requests. The specific adjustments can improve and amplify the unique purposes of each portion during processing of the receiver signal 124 according to the purpose or nature of the information.

It has been further discovered that the adjusted output 350 based on the adjustment criterion 156 provides improved communication efficiency. The adjustment criterion 156 can capture a simple condition that can be used to reduce the effect of the SNR mismatch and the processing errors and complexities resulting therefrom. Moreover, the adjustment criterion 156 can enable use of relatively small lookup-up tables in adjusting the decoding output with two separate adjustment factors.

The adjustment module 308 can use the first communication unit 216, the second communication unit 236, the first control unit 212, the second control unit 234, or a combination thereof to adjust the decoding output and generate the adjusted output 350. The adjustment module 308 can store the adjusted output 350 or an intermediate processing result described above, such as the output adjustment 150 or the separated output data, in the first communication unit 216, the second communication unit 236, the first storage unit 214, the second storage unit 246, or a combination thereof.

After adjusting, the control flow can be passed from the adjustment module 308 to the interleaving module 310. The control flow can pass similarly as described above between the receiver module 301 and the detection module 302 but using output of the adjustment module 308, such as the adjusted output 350.

The interleaving module 310 is configured to adjust or rearrange for interleaving the adjusted output 350 reflecting adjusted instance of the decoding result using the parity portion adjustment 152, the systematic portion adjustment 154, or a combination thereof. The interleaving module 310 can be similar to the arranging module 304. The interleaving module 310 can implement an opposite or a complementary method or process as the arranging module 304. The interleaving module 310 can interleave according to the predetermined coding scheme.

After interleaving, the control flow can be passed from the interleaving module 310 to the detection module 302. The control flow can pass similarly as described above between the receiver module 301 and the detection module 302 but using processing results of interleaving module 310, such as an interleaved instance of the adjusted output 350.

The detection module 302 can use the interleaved instance of the adjusted output 350 as the detector a-priori data 312. The detection module 302 can use the interleaved results for the next iteration, next instance of the code word 110, next instance of the processed transmitter, next instance of the communication block, or a combination thereof.

The detection module 302 can apply the parity portion adjustment 152 and the systematic portion adjustment 154 by setting the detector a-priori data 312 as the interleaved instance of the decoding result, the adjusted output 350, or a combination thereof. The detection module 302 can further apply the parity portion adjustment 152 and the systematic portion adjustment 154 for the iterative detection-decoding mechanism 140 by setting the detector a-priori data 312 as the interleaved instance of the decoding result, the adjusted output 350, or a combination thereof fed forward to the detection module 302.

Figure 4:
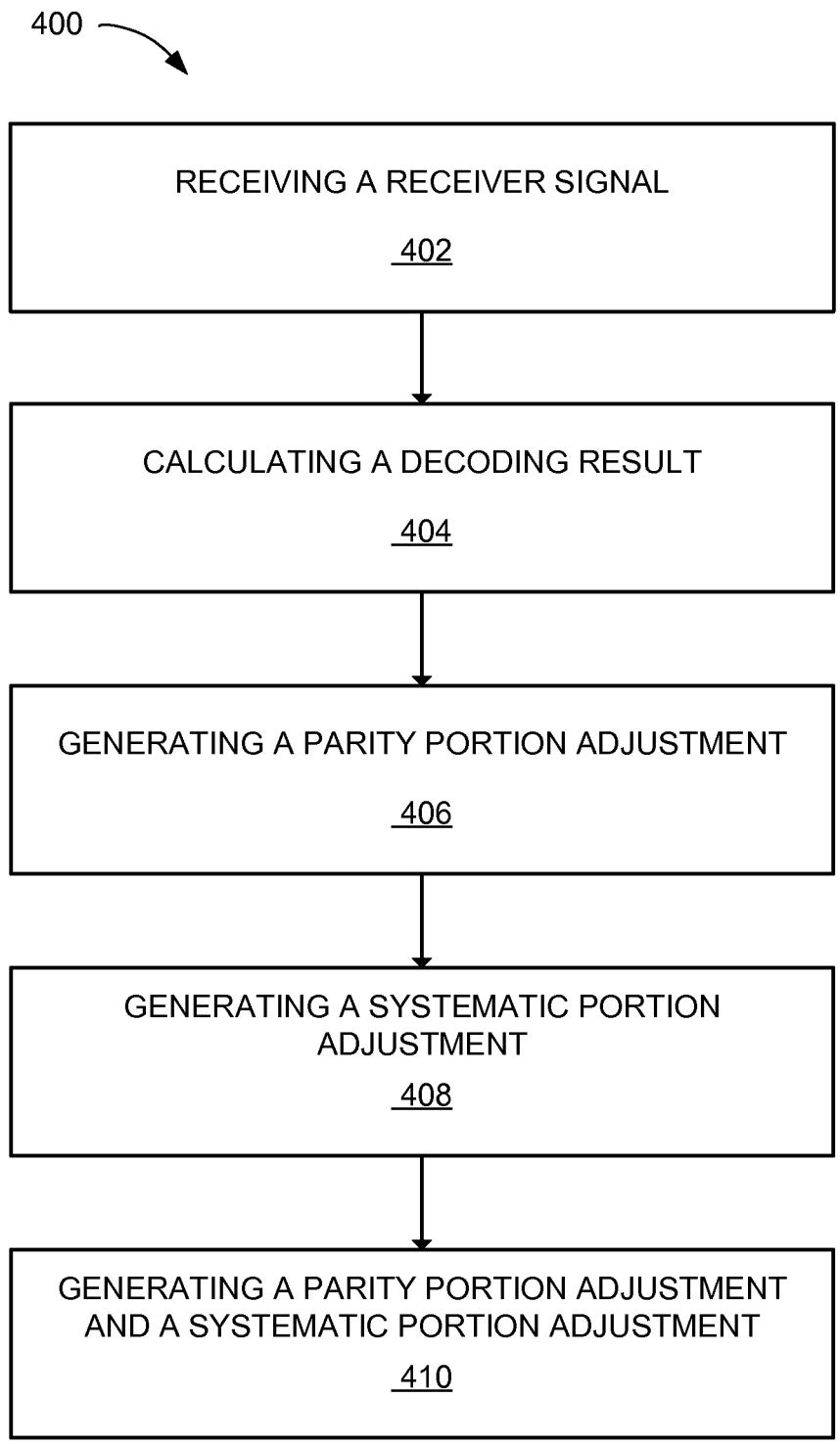
FIG. 4 is a flow chart of a method of operation of a computing system in a further embodiment of the present invention.

Referring now to FIG. 4, therein is shown a flow chart 400 of a method of operation of a computing system in a further embodiment of the present invention. The method 400 includes: receiving a receiver signal for representing a serving signal in a block 402; calculating a decoding result based on decoding the receiver signal in a block 404; generating a parity portion adjustment with a communication unit for adjusting the decoding result in a block 406; generating a systematic portion adjustment with the communication unit for adjusting the decoding result in a block 408; and applying the parity portion adjustment and the systematic portion adjustment to the decoding result for determining the serving signal from the receiver signal in a block 410.

The modules described in this application can be hardware implementation or hardware accelerators, including passive circuitry, active circuitry, or both, in the first communication unit 216 of FIG. 2, the second communication unit 236 of FIG. 2, the first control unit 212 of FIG. 2, the second control unit 238 of FIG. 2, or a combination thereof. The modules can also be hardware implementation or hardware accelerators, including passive circuitry, active circuitry, or both, within the first device 102 of FIG. 1, the second device 106 of FIG. 1, or a combination thereof but outside of the first communication unit 216, the second communication unit 236, the first control unit 212, the second control unit 234, or a combination thereof.

The computing system 100 of FIG. 1 has been described with module functions or order as an example. The computing system 100 can partition the modules differently or order the modules differently. For example, the arranging module 304 or a separate module can calculate the detector extrinsic data 316, the interleaving module 310 or a separate module can calculate the decoder extrinsic data 322, or a combination thereof. As for example, the separation module 330, the parity module 332, the content module 334, or a combination thereof can be combined into a single module.

For illustrative purposes, the various modules have been described as being specific to the first device 102, the second device 106, or a combination thereof. However, it is understood that the modules can be distributed differently. For example, the various modules can be implemented in a different device, or the functionalities of the modules can be distributed across multiple devices. Also as an example, the various modules can be stored in a non-transitory memory medium.

As a more specific example, one or more modules described above can be stored in the non-transitory memory medium for distribution to a different system, a different device, a different user, or a combination thereof, for manufacturing, or a combination thereof. Also as a more specific example, the modules described above can be implemented or stored using a single hardware unit, such as a chip or a processor, or across multiple hardware units.

The modules described in this application can be stored in the non-transitory computer readable medium. The first communication unit 216, the second communication unit 236, the first control unit 212, the second control unit 234, or a combination thereof can represent the non-transitory computer readable medium. The first communication unit 216, the second communication unit 236, the first control unit 212, the second control unit 234, or a combination thereof, or a portion therein can be removable from the first device 102, the second device 106, or a combination thereof. Examples of the non-transitory computer readable medium can be a non-volatile memory card or stick, an external hard disk drive, a tape cassette, or an optical disk.

The physical transformation of the receiver signal 124 of FIG. 1 from the parity portion adjustment 152 of FIG. 1, the systematic portion adjustment 154 of FIG. 1, or a combination thereof results in the movement in the physical world, such as content displayed or recreated for the user on the first user device from processing the serving content therein. The content reproduced on the first device 102, such as navigation information or voice signal of a caller, can influence the user's movement, such as following the navigation information or replying back to the caller. Movement in the physical world results in changes to the channel measures, the geographic location of the first device 102, interfering transmissions, or a combination thereof, which can be fed back into the computing system 100 and influence the decoding output and subsequently the adjusted output 350 of FIG. 3.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of an embodiment of the present invention is that it valuably supports and services the historical trend of reducing costs, simplifying systems, and increasing performance.

These and other valuable aspects of an embodiment of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A computing system comprising:
an inter-device interface configured to receive a receiver signal for representing a serving signal, wherein the receiver signal corresponds to a systematic information and a parity information for representing the serving signal including the systematic information and the parity information;
a communication unit including microelectronics, coupled to the inter-device interface, configured to:
calculate a decoding result based on decoding the receiver signal, generate a systematic output portion and a parity output portion based on decomposing the decoding result by identifying one or more values thereof corresponding to the systematic information and the parity information, generate a parity portion adjustment value for numerically adjusting the decoding result, wherein the parity portion adjustment value corresponds to the parity output portion, generate a systematic portion adjustment value for numerically adjusting the decoding result, wherein the systematic portion adjustment value corresponds to the systematic output portion, and apply the parity portion adjustment value and the systematic portion adjustment value to the decoding result for determining the serving signal from the receiver signal.

2. The system as claimed in claim 1 wherein:
the communication unit is configured to generate the parity portion adjustment value corresponding to the parity information, the systematic portion adjustment value corresponding to the systematic information, or a combination thereof for adjusting the decoding result.

3. The system as claimed in claim 1 wherein:
the communication unit is configured to generate the parity portion adjustment value and the systematic portion adjustment value according to an adjustment criterion for balancing the decoding result for the systematic information and the parity information.

4. The system as claimed in claim 1 wherein the communication unit is configured to generate the parity portion adjustment value and the systematic portion adjustment value based on an adjustment selection factor for characterizing the receiver signal.

5. The system as claimed in claim 1 wherein the communication unit is configured to generate the parity portion adjustment value and the systematic portion adjustment value based on a trigger condition corresponding to an overflow status, a sub-optimal status, or a combination thereof associated with the receiver signal.

6. The system as claimed in claim 1 wherein the communication unit is configured to process the parity portion adjustment value and the systematic portion adjustment value for an iterative detection-decoding mechanism for determining the serving signal.

7. The system as claimed in claim 6 wherein the communication unit is configured to:
calculate a parity average measure associated with a parity statistical variance measure for representing the parity information for the receiver signal;
calculate a systematic average measure associated with a systematic statistical variance measure for representing the systematic information for the receiver signal; and
generate the parity portion adjustment value and the systematic portion adjustment value according to an adjustment criterion for balancing the parity average measure and the systematic average measure.

8. The system as claimed in claim 6 wherein the communication unit is configured to dynamically generate the parity portion adjustment value and the systematic portion adjustment value.

9. The system as claimed in claim 6 wherein the communication unit includes a turbo receiver, an interference-aware receiver, or a combination thereof.

10. A method of operation of a computing system comprising:
receiving a receiver signal for representing a serving signal, wherein the receiver signal corresponds to a systematic information and a parity information for representing the serving signal including the systematic information and the parity information;
calculating a decoding result based on decoding the receiver signal;
generating a systematic output portion and a parity output portion based on decomposing the decoding result by identifying one or more values thereof corresponding to the systematic information and the parity information;
generating a parity portion adjustment value with a communication unit for adjusting the decoding result, wherein the parity portion adjustment value corresponds to the parity output portion:
generating a systematic portion adjustment value with the communication unit for adjusting the decoding result, wherein the systematic portion adjustment value corresponds to the systematic output portion; and
applying the parity portion adjustment value and the systematic portion adjustment value to the decoding result for determining the serving signal from the receiver signal.

11. The method as claimed in claim 10 wherein:
generating the parity portion adjustment value and the systematic portion adjustment value includes generating the parity portion adjustment value corresponding to the parity information, the systematic portion adjustment value corresponding to the systematic information, or a combination thereof for adjusting the decoding result.

12. The method as claimed in claim 10 wherein:
generating the parity portion adjustment value and the systematic portion adjustment value includes generating the parity portion adjustment value and the systematic portion adjustment value according to an adjustment criterion for balancing the decoding result for the systematic information and the parity information.

13. The method as claimed in claim 10 wherein generating the parity portion adjustment value and the systematic portion adjustment value includes generating the parity portion adjustment value and the systematic portion adjustment value based on an adjustment selection factor for characterizing the receiver signal.

14. The method as claimed in claim 10 wherein generating the parity portion adjustment value and the systematic portion adjustment value includes generating the parity portion adjustment value and the systematic portion adjustment value based on a trigger condition corresponding to an overflow status, a sub-optimal status, or a combination thereof associated with the receiver signal.

15. A non-transitory computer readable medium including instructions for a computing system comprising:
receiving a receiver signal for representing a serving signal, wherein the receiver signal corresponds to a systematic information and a parity information for representing the serving signal including the systematic information and the parity information;
calculating a decoding result based on decoding the receiver signal;
generating a systematic output portion and a parity output portion based on decomposing the decoding result by identifying one or more values thereof corresponding to the systematic information and the parity information;

generating a parity portion adjustment value with a communication unit for adjusting the decoding result, wherein the parity portion adjustment value corresponds to the parity output portion;

generating a systematic portion adjustment value with the communication unit for adjusting the decoding result, wherein the systematic portion adjustment value corresponds to the systematic output portion; and applying the parity portion adjustment value and the systematic portion adjustment value to the decoding result for determining the serving signal from the receiver signal.

16. The non-transitory computer readable medium as claimed in claim 15 wherein:

generating the parity portion adjustment value and the systematic portion adjustment value includes generating the parity portion adjustment value corresponding to the parity information, the systematic portion adjustment value corresponding to the systematic information, or a combination thereof for adjusting the decoding result.

17. The non-transitory computer readable medium as claimed in claim 15 wherein:

generating the parity portion adjustment value and the systematic portion adjustment value includes generating the parity portion adjustment value and the systematic portion adjustment value according to an adjustment criterion for balancing the decoding result for the systematic information and the parity information.

18. The non-transitory computer readable medium as claimed in claim 15 wherein generating the parity portion adjustment value and the systematic portion adjustment value includes generating the parity portion adjustment value and the systematic portion adjustment value based on an adjustment selection factor for characterizing the receiver signal.

19. The non-transitory computer readable medium as claimed in claim 15 wherein generating the parity portion adjustment value and the systematic portion adjustment value includes generating the parity portion adjustment value and the systematic portion adjustment value based on a trigger condition corresponding to an overflow status, a sub-optimal status, or a combination thereof associated with the receiver signal.

* * * * *